(12) United States Patent
Peets et al.

(10) Patent No.: US 7,491,900 B1
(45) Date of Patent: Feb. 17, 2009

(54) EMC GASKET FILLER AND METHOD

(75) Inventors: Michael T. Peets, Staatsburg, NY (US);
Andrew Rybak, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/863,989

(22) Filed: Sep. 28, 2007

(51) Int. Cl.
*H05K 9/00* (2006.01)
*H02B 1/06* (2006.01)

(52) U.S. Cl. .................. 174/383; 174/382; 361/685
(58) Field of Classification Search .......... 174/382, 174/383; 454/184; 361/800, 816, 818, 685
See application file for complete search history.

(56) References Cited

U.S. PATENT DOCUMENTS

| | | | |
|---|---|---|---|
| 5,654,873 A * | 8/1997 | Smithson et al. | 361/685 |
| 6,005,186 A | 12/1999 | Bachman | |
| 6,043,992 A * | 3/2000 | Scheibler | 361/818 |
| 6,198,040 B1 * | 3/2001 | Desousa et al. | 174/375 |
| 6,204,444 B1 * | 3/2001 | Pugliese et al. | 174/358 |
| 6,278,617 B1 | 8/2001 | Yang et al. | |
| 6,281,433 B1 * | 8/2001 | Decker et al. | 174/394 |
| 6,359,768 B1 | 3/2002 | Eversley et al. | |
| 6,483,032 B2 * | 11/2002 | Adams | 174/66 |
| 6,552,261 B2 | 4/2003 | Shlahtichman et al. | |
| 6,646,197 B1 * | 11/2003 | Cugalj et al. | 174/355 |
| 6,654,256 B2 | 11/2003 | Gough | |
| 6,660,932 B1 * | 12/2003 | Barringer et al. | 174/358 |
| 6,794,571 B1 | 9/2004 | Barringer et al. | |
| 6,924,988 B2 | 8/2005 | Barringer et al. | |
| 7,258,574 B2 | 8/2007 | Barringer et al. | |
| 2002/0185294 A1 | 12/2002 | Shlyakhtichman et al. | |
| 2007/0151759 A1 | 7/2007 | Marnell et al. | |

* cited by examiner

*Primary Examiner*—Hung V Ngo
(74) *Attorney, Agent, or Firm*—Cantor Colburn LLP; Lily Neff

(57) ABSTRACT

An electromagnetic gasket includes a first conductive shell having a pair of first side walls and a pair of first end walls extending from a first bottom wall defining a first opening, the pair of first side walls each having at least one first outward bias positioned thereon, the pair of first end walls each having a first tab extending therefrom, and the first bottom wall having an array of first openings and a pair of apertures; and a second conductive shell having a pair of second side walls and a pair of second end walls extending from a second bottom wall defining a second opening, the pair of second side walls and pair of second end walls each having at least one second outward bias positioned thereon, and the second bottom wall having an array of second openings. The First outward bias is configured to electrically connect to an inner surface defining an empty slot of an electrical enclosure. The second outward bias electrically connects the second conductive shell to first conductive shell when the second conductive shell is disposed within the first opening defined by the first conductive shell.

19 Claims, 5 Drawing Sheets

EMC GASKET FILLER AND METHOD

BACKGROUND OF THE INVENTION

1. Field of the Invention

The present invention relates to an electromagnetic compatibility (EMC) sealing apparatus and related method; and more particularly to an EMC sealing apparatus and method for an empty slot of an electrical enclosure used in computing system environments.

2. Description of Background

It is an industry goal to continuously increase the number of electronic components inside an electronic device. This goal is driven by several key and important reasons. The first and more obvious one is for the convenience of compactness. Compactness allows for selective fabrication of smaller and lighter devices that are more attractive to the consumer. Some of the reasons for such appeal stem from a desire for easier transportation, shipping, installation and storage of such devices. In other instances, when compactness per se is not a driving factor, providing the same number of devices in only a fraction of available footprint allows the remaining space to be filled with more components which will increase system performance and speed. In addition, compactness also allows many of the circuits to operate at higher frequencies and at higher speeds due to shorter electrical distances in these devices. Unfortunately, despite many of the advantages associated with this industry goal, there are several important challenges that have to be overcome by the designers of these systems.

One area where the challenges and advantages provided by such compact densities is increased is in the computer industry. The reliance of many businesses on computers and computer networks in recent years, demands an ever increasing need to provide fast and accurate systems in the smallest and lightest allowable footprint. In a computing environment, whether comprising of a simple personal computer, or a complex system comprising of a number of computers in processing communication with one another, a plurality of printed circuit boards and cards are provided that house many electronic components and even devices.

A particularly challenging area for the designers of these systems is the issue of resolving electromagnetic interference (EMI). As the number of components are increased, electromagnetic leakage concerns continue to grow. This is because every electronic device, emits some form of electromagnetic radiation. If unresolved, EMI can affect system performance, data integrity and speed. Obviously, in larger system environments, the increased number of components that are stored in close proximity to one another, greatly increases the EMI concerns. This is because while such effects can be tolerated when few devices and components exist, the increasing number of components and devices can seriously impact system integrity and performance. This problem is further exacerbated by the improvement in semiconductor devices which allow them to operate at higher speeds, generally causing emission in higher frequency bands where interference is more likely to occur.

Prior art attempts have been made to minimize the interference problem. Electromagnetic compatibility (EMC) requires that emissions from a given device be reduced by shielding or other similar means. Such shieldings are designed not only to reduce emissions from the device itself, but also to reduce sensitivity of the device to external fields such as fields from other devices. One type of such EMI shieldings are EMI gaskets.

In recent designs, it is necessary to use a metallic type of electromagnetic gasket filler to contain EMC emissions in an electrical enclosure in which a device having a printed circuit board or card assembly engaged therewith is absent from a slot of the enclosure, thereby leaving an open and empty slot. However, a common problem with such gaskets are that they do not fully contain EMC emissions when the slot is not populated by an active card assembly. The conventional style EMC gasket filler is configured as a single layer screen allowing escape of EMC energy therethrough. Since the conventional style EMC gasket filler does not fully contain EMC emissions, it doesn't provide suitable EMI protection and may even pose a threat for a potential short.

While the conventional EMC gasket filler solves many of the prior art problems, it is desirable to introduce a mechanism that can contain more, if not all, EMC emissions when a slot of an electrical enclosure used in computing system environments is not populated by an active card assembly. Accordingly, a need exists for a method and apparatus for providing enhanced EMC shielding for an empty slot of an electrical enclosure used in computing system environments. Such an enhanced EMC gasket filler should be mechanically stable to ensure a continuous grounding and designed to facilitate removal and installation thereof. In addition, it is desired that the manufacturing costs for the enhanced EMC gasket filler for shielding an empty slot of an electrical enclosure used in computing system environments be reduced.

SUMMARY OF THE INVENTION

The foregoing discussed drawbacks and deficiencies of the prior art are overcome or alleviated by an exemplary embodiment of an electromagnetic gasket which includes a first conductive shell having a pair of first side walls and a pair of first end walls extending from a first bottom wall defining a first opening, the pair of first side walls each having at least one first outward bias positioned thereon, the pair of first end walls each having a first tab extending therefrom, and the first bottom wall having an array of first openings and a pair of apertures; and a second conductive shell having a pair of second side walls and a pair of second end walls extending from a second bottom wall defining a second opening, the pair of second side walls and pair of second end walls each having at least one second outward bias positioned thereon, and the second bottom wall having an array of second openings. The First outward bias is configured to electrically connect to an inner surface defining an empty slot of an electrical enclosure. The second outward bias electrically connects the second conductive shell to first conductive shell when the second conductive shell is disposed within the first opening defined by the first conductive shell.

In another exemplary embodiment, a computer is disclosed. The computer includes: an enclosure having walls which are electrically conductive; an opening in the enclosure defined by the walls, the opening defining a slot configured to receive a card assembly; an electromagnetic shield mounted to the opening for resisting the passage of electromagnetic emission. The electromagnetic shield includes: a first conductive shell having a pair of first side walls and a pair of first end walls extending from a first bottom wall defining a first opening, the pair of first side walls each having at least one first outward bias positioned thereon, the pair of first end walls each having a first tab extending therefrom, and the first bottom wall having an array of first openings and a pair of apertures; and a second conductive shell having a pair of second side walls and a pair of second end walls extending from a second bottom wall defining a second opening, the pair of second side walls and pair of second end walls each having at least one second outward bias positioned thereon, and the second bottom wall having an array of second openings. The first outward bias is configured to electrically connect to an inner surface of the walls defining the slot of the enclosure. The second outward bias electrically connects the second conductive shell to first conductive shell when the second conductive shell is disposed within the first opening defined by the first conductive shell.

In yet another exemplary embodiment, a method of EMC sealing an empty slot of an electrical enclosure is disclosed. The method includes: assembling a first conductive shell with a second conductive shell, the first conductive shell having a pair of first side walls and a pair of first end walls extending from a first bottom wall defining a first opening, the pair of first side walls each having at least one first outward bias positioned thereon, the pair of first end walls each having a first tab extending therefrom, and the first bottom wall having an array of first openings and a pair of apertures; and a second conductive shell having a pair of second side walls and a pair of second end walls extending from a second bottom wall defining a second opening, the pair of second side walls and pair of second end walls each having at least one second outward bias positioned thereon, and the second bottom wall having an array of second openings. The first outward bias is configured to electrically connect to an inner surface defining the empty slot of the electrical enclosure. The second outward bias electrically connects the second conductive shell to first conductive shell when the second conductive shell is disposed within the first opening defined by the first conductive shell.

BRIEF DESCRIPTION OF THE DRAWINGS

Referring now to the figures, which are exemplary embodiments, and wherein the like elements are numbered alike.

DETAILED DESCRIPTION OF THE INVENTION

Referring generally to the figures, an electrical enclosure 10 having a plurality of slots 12 for mounting a card assembly 14 into a computer system is shown, in accordance with an embodiment of the invention. electrical enclosure 10 preferably provides structural support to the card assembly 14 so as to allow for the easy insertion and removal of the card assembly 14 from a computer system, as well as thermal and electrical isolation from other card assemblies and components within the computer system. It will also be noted that although the present invention will be described with reference to providing an EMC filler gasket with respect to the electrical enclosure 10 and a computer system, that the present invention may be employed with other devices in conjunction with an electrical enclosure.

The electrical enclosure 10 is disposed onto a computer system main board or main printed circuit board (PCB) (not shown). The electrical enclosure 10 is preferably slidably engaged with a system rack (not shown) using handle 16, as known to those skilled in the pertinent art.

Figure 1:
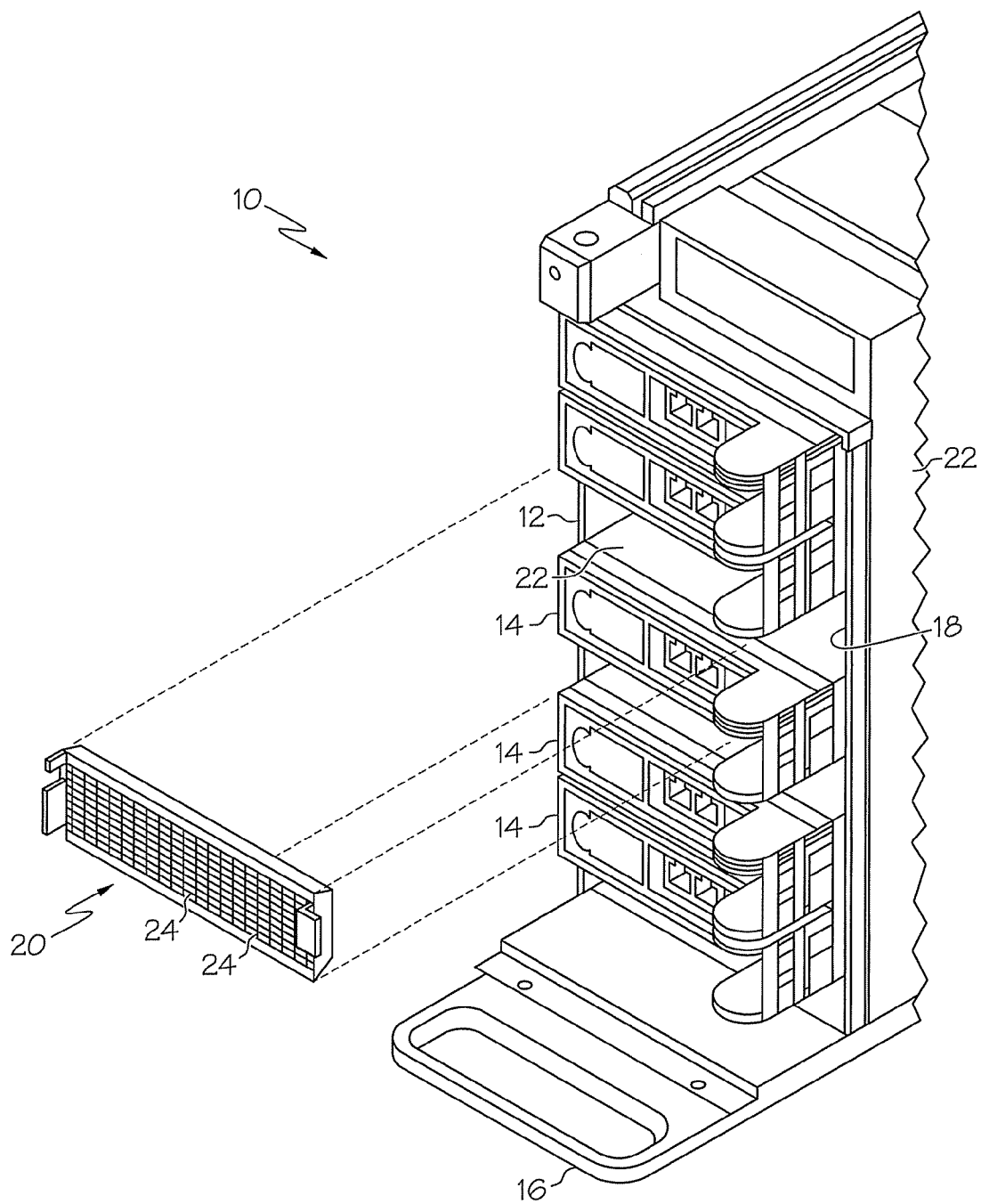
FIG. 1 is an exploded perspective partial view of a computer system having a plurality of card assemblies installed therewith and an EMC gasket filler for an empty slot of the computer system in accordance with an embodiment of the invention.

As illustrated in FIG. 1, the electrical enclosure 10 includes six slots, five of which are filled with a corresponding card assembly 14, leaving one empty open slot 12. As illustrated in FIG. 1, each card assembly may be either an optical module or an electrical module.

An opening 18 defining the empty slot of the electrical enclosure 10 is filled with an EMC gasket filler 20 (see FIG. 6) in order provide a cage effect to trap EMC energy that attempts to escape from the opening due to the empty slot 12 being unpopulated by an active card assembly 14. EMC gasket filler 20 closes opening 18 by attachment to walls 22 defining opening 18 discussed more fully herein below. EMC gasket filler 20 is configured to provide electrical continuity between opposing walls 22, and thus provide EMC shielding while allowing air to flow into and out of the docking apparatus 10 through vents 24 configured in EMC gasket filler 20.

Figure 2:
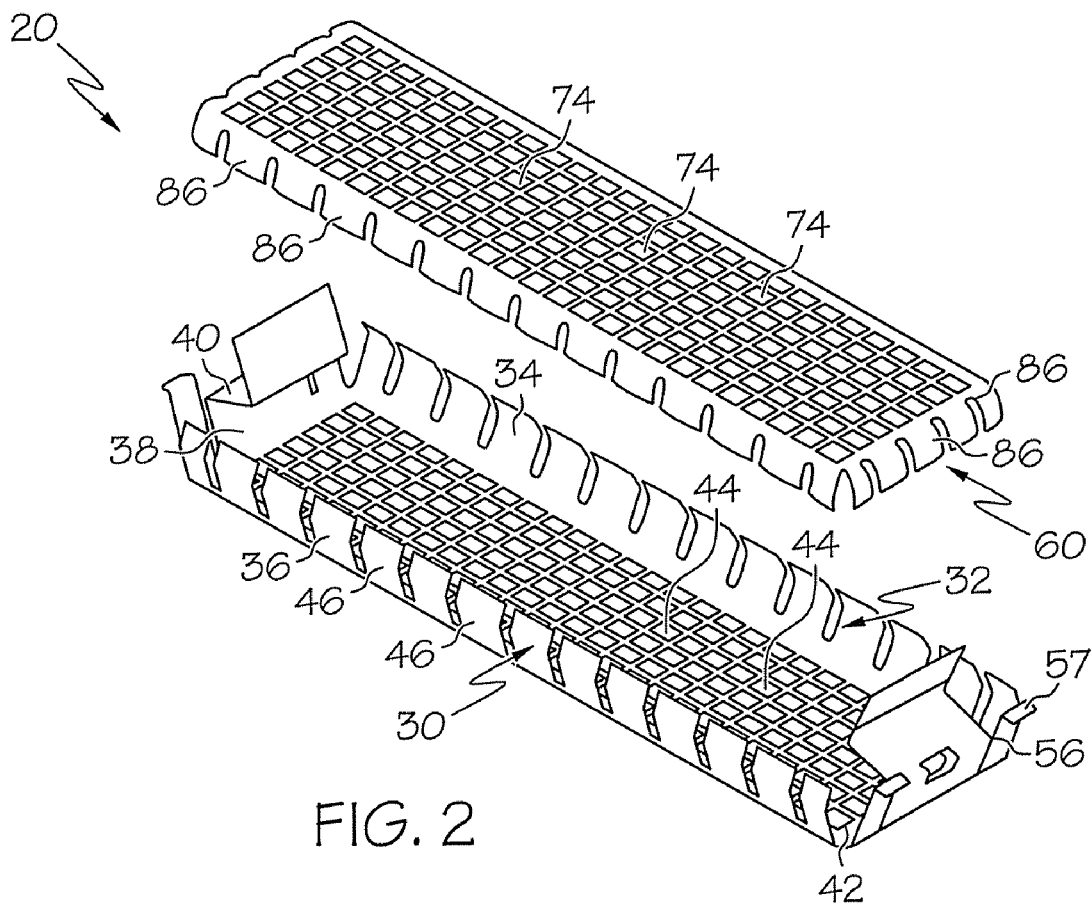
FIG. 2 is an exploded perspective view of first and second conductive shells barriers of the EMC gasket filler of FIG. 1 in accordance with an embodiment of the invention.
Figure 3:
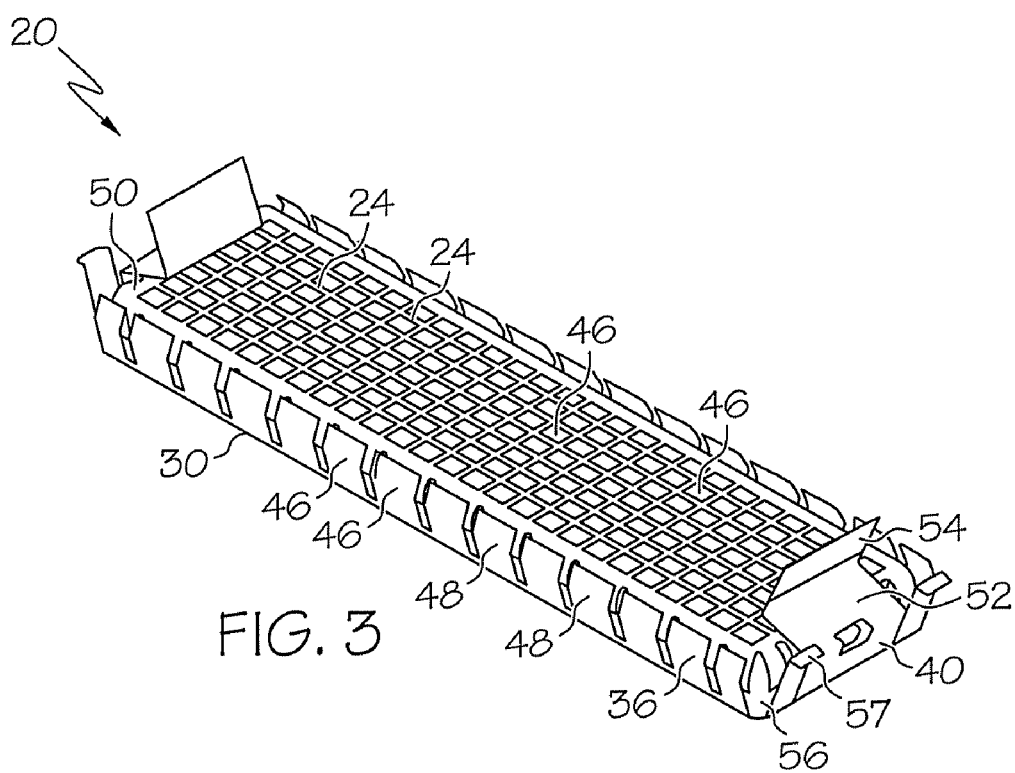
FIG. 3 is a perspective view of the second conductive shell assembled with the first conductive shell of FIG. 2 in accordance with an embodiment of the invention.
Figure 4A:
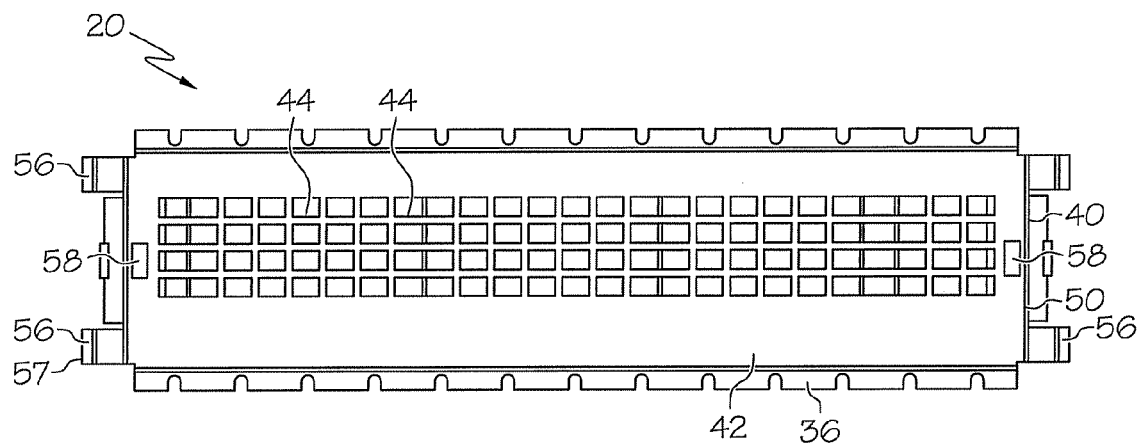
FIGS. 4A-4C is a bottom plan view, side view and end view, respectively, of the first conductive shell of FIG. 2 in accordance with the present invention.
Figure 4B:
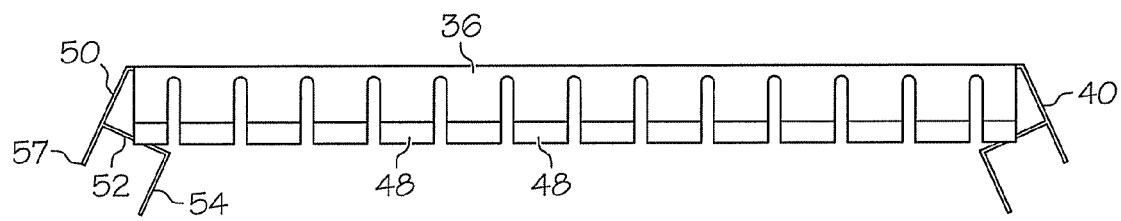
Figure 4C:
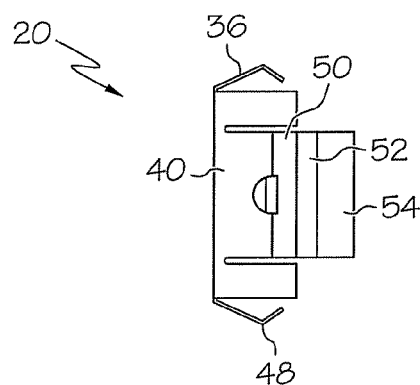

Referring now to FIGS. 2-4, gasket filler 20 is an electromagnetic gasket formed of a first conductive shell 30 configured to receive a second conductive shell 60. The first conductive shell 30 is configured as an open box structure defining at least the one opening 32 in which to realasably receive second conductive shell 60 therethrough and make electrical contact with an inner surface 34 of a pair of first side walls 36 and an inner surface 38 of a pair of first end walls 40. A bottom wall 42 connects the pair of first side walls 36 and the pair of first end walls 40. The bottom wall 42 further defines vents 24 via an array of openings 44 configured therein. In an exemplary embodiment as shown, EMC gasket 20 is configured as a single one piece open box structure defining a single opening 32 in which to receive second conductive shell 50 therein and with an opposite closed end via bottom wall 42.

The pair of first side walls 36 and first end walls 40 define opening 32. The pair of first side walls 36 each have a plurality of first fingers 46 positioned thereon and segmented along a length defining each first side wall 34. Each of the first fingers 46 is configured as an outward bias. However, it is contemplated that each finger 46 may be configured to provide both an inward and outward bias as suitable for the desired end purpose.

Each first finger 46 configured with an outward bias is configured to electrically connect to a corresponding wall 22 defining the empty slot 12 of the docking apparatus 10, thereby ensuring electrical continuity between opposing walls 20 and preventing escape of any EMC energy trapped in the slot 12. The gasket filler 30 is preferably formed of a single one piece electrically conductive material fully contained between the upper and lower walls 22 defining opening 18 of the docking apparatus 10.

Still referring to FIGS. 2-4, an intermediate portion 48 of each of the first fingers 46 is a bight portion configured to flex allowing differently configured openings 18 to be used while still making a suitable ground contact. In particular, the flexing of the first fingers 46 allows the shell 30 to be engaged between the upper and lower walls 22 defining the opening 18. In this manner, the flexible first fingers 46 compensates for distance between opposing fingers 46 on respective opposing side walls 36 being larger than a distance between the upper and lower walls 18 as illustrated in FIG. 1. It will be recognized that the bight portion 48 of each finger 46 facilitates compression thereof.

Further, each of the first end walls 40 includes a first tab 50 extending at an acute angle from the bottom wall 42 extending outwardly from an edge of the bottom wall 42 to which the end walls 40 are joined, as best illustrated in FIG. 4B. First tab 50 includes a first extension 52 extending inwardly substantially perpendicular to first tab 50. A second extension 54 extends outwardly substantially perpendicular to the first extension 52 first tab 50 and extends substantially parallel to first tab 50.

Each of the first end walls 40 further includes a second angle tab 56 disposed next to opposite sides of the first angle tab 50. Each second tab 56 extends at an acute angle from the bottom wall 42 substantially parallel to the first tab 50. As seen in FIGS. 2-4, the first tab 50 is inboard of the second tabs 56 disposed on either side of a respective first tab 50. Each second tab 56 includes a flared out terminal end 57 to facilitate positioning outside of opposing side walls 22 of docking apparatus 10.

In particular, the angled first tab 50 extending into opening 18 flexes via manual squeezing of second extensions 54 to allow insertion thereof into the opening 18 while the opposing pairs of flared out terminal ends 57 of second tabs 56 abut edges defining respective opposing side walls 22. The opposing pairs of flared out terminal ends 57 prevent the conductive shell 30 from being completely inserted through the opening 18. In this manner, when the squeezing of the opposing second extensions 54 ceases, the flexible angle tabs 50 provide additional retention of shell 30 within opening 18.

Bottom wall 42 includes a pair of apertures 58 in which to receive a corresponding angled tab or fixing tab 62 of second conductive shell 60 aligned therewith. In an exemplary embodiment as best illustrated in FIG. 5B, the apertures 58 are located at opposing longitudinal ends of the bottom wall 42, outbound of the array of openings 44 along a central longitudinal axis defining bottom wall 42.

Figure 5A:
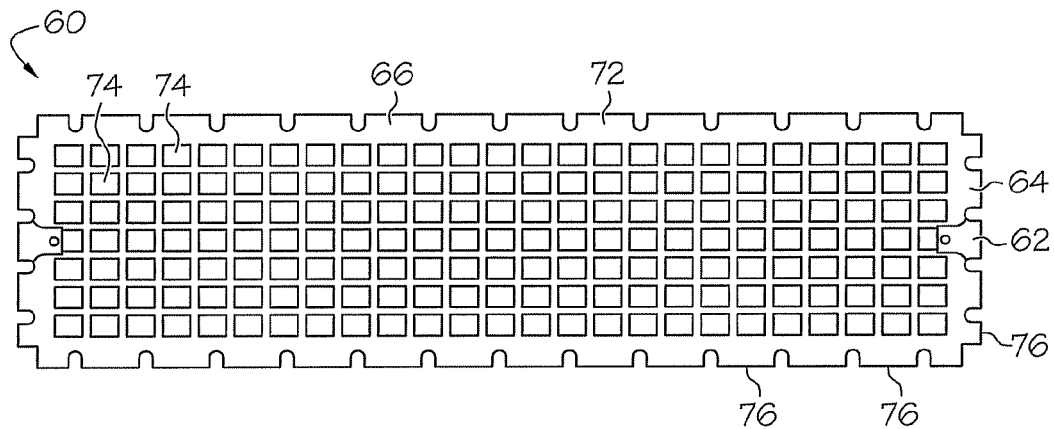
FIGS. 5A-5C is a bottom plan view, side view and end view, respectively, of the second conductive shell of FIG. 2 in accordance with the present invention.
Figure 5B:
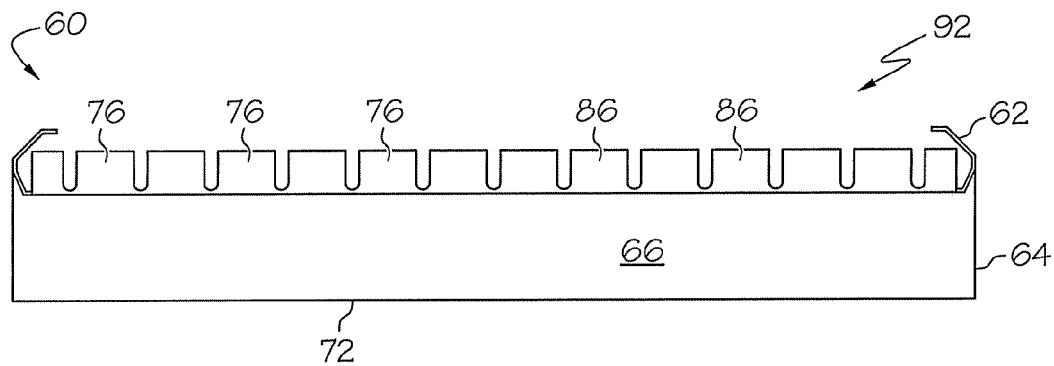
Figure 5C:
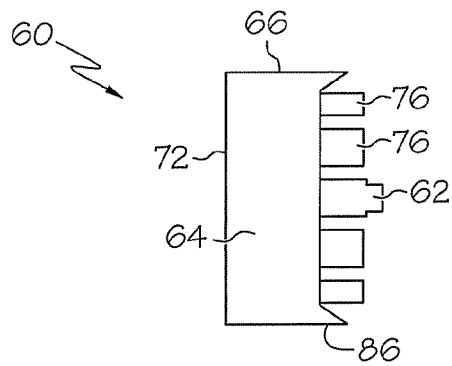

Referring now to FIGS. 5A-5C, the second conductive shell 60 of EMC gasket filler 20 will be described more fully below. The second conductive shell 60 is similar to the first conductive shell 30 described with reference to FIGS. 2-4, but for opposing second end walls 64 having a second plurality of conductive fingers 76 and the angled tab or fixing tab 62 extending from one of the conductive fingers 76 on each end wall 64. Therefore, duplicative elements will not be described in detail and differences therebetween will be pointed out.

More specifically, gasket 20 further includes second conductive shell 60 defined by a bottom wall 72 having a pair of second side walls 66 and the pair of second end walls 64 extending from bottom wall 72. Bottom wall 72 includes an array of second openings 74 further defining vents 24.

Like the first conductive shell 20, the second conductive shell 60 includes the second plurality of conductive fingers 76 extending from the pair of second side walls 66 as an outward bias. Unlike, the first conductive shell 20, the second conductive shell 60 includes the second plurality of conductive fingers 76 extending from the pair of second end walls 64. The second plurality of conductive fingers 76 surround an entire perimeter defined by the side and end walls 66, 64 and extend outside of the perimeter defined by the side and end walls, 66, 64. The second plurality of conductive fingers 76 provide a continuous ground path between the first and second conductive shells 20 and 60 when the second conductive shell 60 is installed with the first conductive shell 20.

An intermediate portion of each of the second plurality of conductive fingers 76 includes a bight portion 86 configured to flex facilitating installation of the second conductive shell 60 in the opening 32 defined by first conductive shell 30 while still making a suitable ground contact, as in the first plurality of conductive fingers 36 described with reference to FIGS. 2-4. In addition, a terminal end of each of the second plurality of conductive fingers 76 is rounded to facilitate compression thereof as each contacts inner face 34 of the first plurality of conductive fingers 46 and inner face 38 of first end walls 40 when installing the second conductive shell 60 in the opening 32 defined by first conductive shell 30. As described above, each opposing end wall 64 of the second conductive shell 60 includes a corresponding angled tab or fixing tab 62 aligned with a respective aperture 58 in the first conductive shell 30. A terminal end of each angled tab 62 extends through the respective aperture 58 to releasably retain the second conductive shell 60 with the first conductive shell 30. In this manner, the array of openings 44 and 74 in each of the first and second conductive shells 30 and 60 define first and second screen barriers, respectively, which provide a cage effect for trapping EMC energy that would have escaped using a single screen barrier.

More specifically, FIG. 5B illustrates the plurality of second plurality of conductive fingers 76 defining an opening 92. Assembly of the first and second conductive shells 30 and 60 together provides for the respective openings 32 and 92 to face each other and having the bottom walls 42 and 72 of each being spaced apart from one another, thereby creating a cage therebetween.

Figure 6:
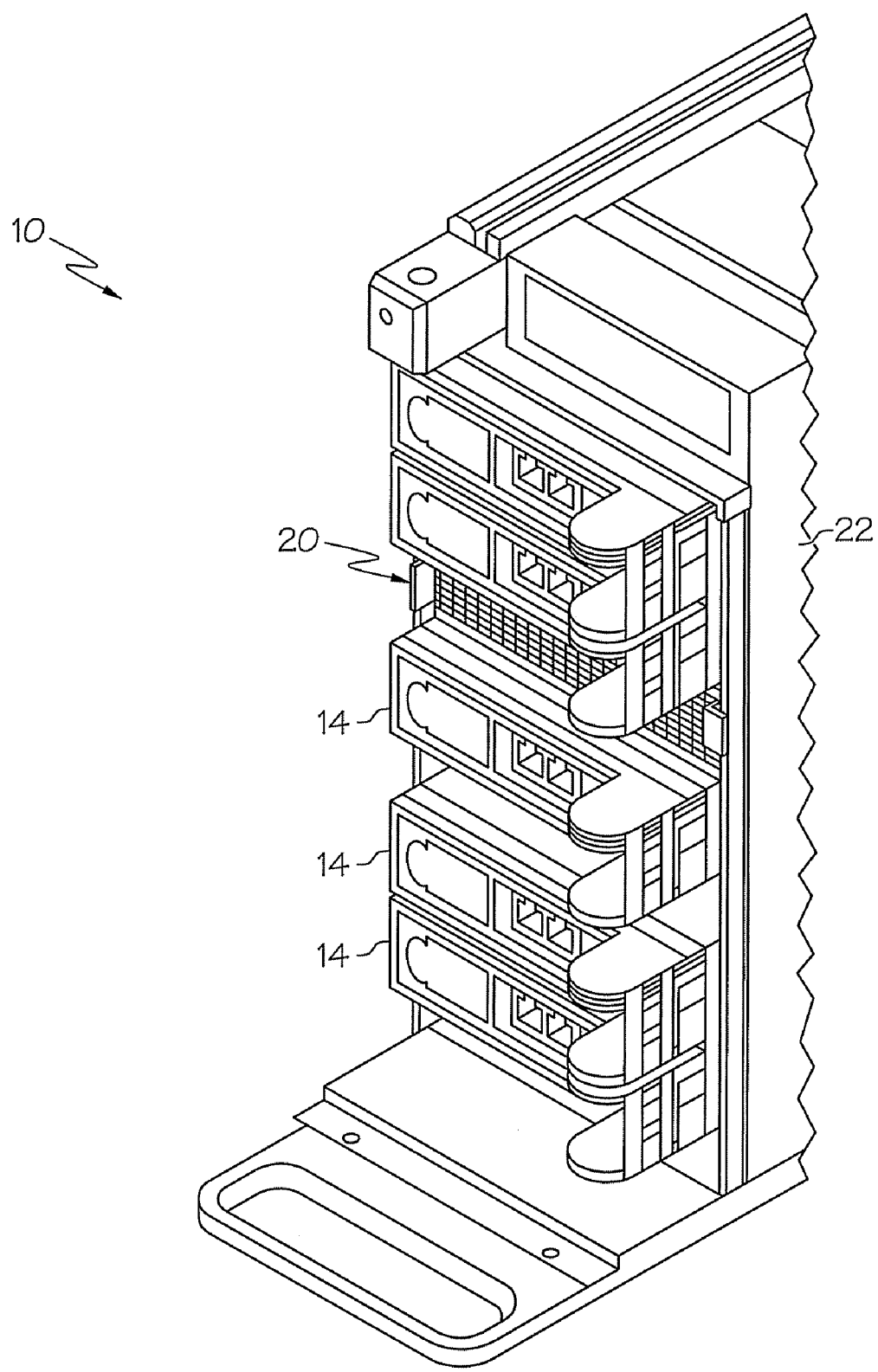
FIG. 6 is an exploded perspective partial view of the computer system having the plurality of card assemblies of FIG. 1 installed in slots and the EMC gasket filler installed in the empty slot of the computer system in accordance with an embodiment of the invention.

FIG. 6 is an exploded perspective partial view of the computer system having the plurality of card assemblies 14 installed in slots and the EMC gasket filler 20 installed in the empty slot 12 of the computer system in accordance with an embodiment of the invention. The bight portions 48 of the first plurality of conductive fingers 46 compress against an inner surface defining the upper and lower walls 22 of the slot 12 of the docking apparatus 10. The terminal ends 57 of second tabs 56 of the first conductive shell 30 abut edges defining respective opposing side walls 22. When the EMC gasket filler 20 is assembled and installed in opening 18 not populated by an active card assembly 14, the EMC gasket filler 20 removably closes the opening 18 formed between opposing walls 22 to form electrical continuity therebetween while being sandwiched therebetween.

The inventive EMC gasket filler is thus quickly and easily assembled with a slot that is not populated by an active card assembly. The EMC gasket filler virtually eliminates loss of electrical contact between the opposing walls defining the empty slot along with the double screen barrier ensuring continuous grounding and shielding. Therefore with use of the inventive EMC gasket filler, the negative effects of EMC and electrostatic discharge (ESD) are significantly reduced.

The first and second plurality of conductive fingers 36 and 76 are compressible to provide electrical continuity between the two conductive shells 30 and 60 and corresponding walls 22 defining opening 18 when gasket filler 20 is disposed therein providing air flow, while also providing and EMC sealing. In addition, although the plurality of conductive fingers have been described as forming an angled tab or including an intermediate bight portion, other configurations, such as, including for example, but not limited to, a finger having an S or C shape structure, and the like, may be alternatively employed.

In accordance with exemplary embodiments of the invention and referring to the Figures, each of the conductive shells 30, 60 defining the EMC gasket filler 20 is preferably constructed from a rigid material having sufficient strength and electromagnetic compatibility properties, such as beryllium copper and/or stainless steel. However, it is considered within the scope of the invention that gasket filler 20 may be constructed from any material suitable to the desired end purpose.

Because of its simple design, each of the conductive shells 30, 60 defining the inventive EMC gasket filler may be inexpensively manufactured from a single sheet of material. Each conductive shell 30, 60 is preferably made of a single one piece thin sheet, e.g., 0.005 to 0.010 inches thick, of stainless steel or beryllium copper. Other materials may be similarly employed. The plurality of conductive fingers and tabs are formed surrounding an entire perimeter of the bottom wall when the thin sheet is cut/stamped and folded.

Although the present invention has been described in accordance with a docking apparatus as it relates with a computer system, it will be understood that the present invention is not limited thereto and that the present invention may be incorporated for providing a EMC gasket filler for a device associated with any electrical enclosure.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. An electromagnetic gasket filler comprising:
a first conductive shell having a pair of first side walls and a pair of first end walls extending from a first bottom wall defining a first opening, the pair of first side walls each having at least one first outward bias positioned thereon, the pair of first end walls each having a first tab extending therefrom, and the first bottom wall having an array of first openings and a pair of apertures; and
a second conductive shell having a pair of second side walls and a pair of second end walls extending from a second bottom wall defining a second opening, the pair of second side walls and pair of second end walls each having at least one second outward bias positioned thereon, and the second bottom wall having an array of second openings,
wherein said first outward bias is configured to electrically connect to an inner surface defining an empty slot of an electrical enclosure, the second outward bias electrically connecting the second conductive shell to first conductive shell when the second conductive shell is disposed within the first opening defined by the first conductive shell.

2. The electromagnetic gasket filler of claim 1, wherein the at least one first outward bias includes a first plurality of conductive fingers configured in the first pair of side walls, and the at least one second outward bias includes a second plurality of conductive fingers configured in the pair of second side walls and second end walls, the second plurality of conducive fingers surrounding an entire perimeter defining the second opening and extending outside thereof.

3. The electromagnetic gasket filler of claim 2, wherein the first and second plurality of conductive fingers provide a continuous ground path therebetween when the first and second conductive shells are assembled together having the first and second openings face each other.

4. The electromagnetic gasket filler of claim 3, wherein the first and second bottom walls are spaced apart from each defining a cage together with the first and second plurality of conductive fingers.

5. The electromagnetic gasket filler of claim 3, wherein a conductive finger of the second plurality of conductive fingers disposed at each second end wall is extended as a fixing tab to be received in a corresponding aperture in the first bottom wall to releasably retain the first and second conductive shells together.

6. The electromagnetic gasket filler of claim 5, wherein each of the pair of first end walls includes a second angled tab on either side of the first angled tab configured to prevent the first conductive shell from being fully inserted into a slot opening.

7. The electromagnetic gasket filler of claim 6, wherein an intermediate portion of each of the first and second plurality of conductive fingers is a bight portion configured to flex allowing differently configured slot openings to be used while still making a suitable ground contact.

8. The electromagnetic gasket filler of claim 1, wherein a terminal end of each of the second plurality of conductive fingers is rounded to facilitate compression of the second plurality of conductive fingers.

9. The electromagnetic gasket filler of claim 1, wherein the first and second conductive shells are made from a metallic material.

10. The electromagnetic gasket filler of claim 9, wherein the metal conductive shell is one of BeCu or stainless steel or any other EMC conductive material.

11. A computer, comprising:
an enclosure having walls which are electrically conductive;
an opening in the enclosure defined by the walls, the opening defining a slot configured to receive a card assembly;
an electromagnetic shield mounted to the opening for resisting the passage of electromagnetic emissions; the electromagnetic shield comprising:
a first conductive shell having a pair of first side walls and a pair of first end walls extending from a first bottom wall defining a first opening, the pair of first side walls each having at least one first outward bias positioned thereon, the pair of first end walls each having a first tab extending therefrom, and the first bottom wall having an array of first openings and a pair of apertures; and
a second conductive shell having a pair of second side walls and a pair of second end walls extending from a second bottom wall defining a second opening, the pair of second side walls and pair of second end walls each having at least one second outward bias positioned thereon, and the second bottom wall having an array of second openings,
wherein said first outward bias is configured to electrically connect to an inner surface of the walls defining the slot of the enclosure, the second outward bias electrically connecting the second conductive shell to first conductive shell when the second conductive shell is disposed within the first opening defined by the first conductive shell.

12. The electromagnetic gasket filler of claim 11, wherein the at least one first outward bias includes a first plurality of conductive fingers configured in the first pair of side walls, and the at least one second outward bias includes a second plurality of conductive fingers configured in the pair of second side walls and second end walls, the second plurality of conducive fingers surrounding an entire perimeter defining the second opening and extending outside thereof.

13. The electromagnetic gasket filler of claim 12, wherein the first and second plurality of conductive fingers provide a continuous ground path therebetween when the first and second conductive shells are assembled together having the first and second openings face each other and the first and second bottom walls are spaced apart from each defining a cage together with the first and second plurality of conductive fingers.

14. The electromagnetic gasket filler of claim 13, wherein a conductive finger of the second plurality of conductive fingers disposed at each second end wall is extended as a fixing tab to be received in a corresponding aperture in the first bottom wall to releasably retain the first and second conductive shells together.

15. The electromagnetic gasket filler of claim 14, wherein each of the pair of first end walls includes a second angled tab on either side of the first angled tab configured to prevent the first conductive shell from being fully inserted into a slot opening.

16. The electromagnetic gasket filler of claim 15, wherein an intermediate portion of each of the first and second plurality of conductive fingers is a bight portion configured to flex allowing differently configured slot openings to be used while still making a suitable ground contact.

17. The electromagnetic gasket filler of claim 11, wherein a terminal end of each of the second plurality of conductive fingers is rounded to facilitate compression of the second plurality of conductive fingers.

18. The electromagnetic gasket filler of claim 11, wherein the first and second conductive shells are each a single one piece electrically conductive material.

19. A method of EMC sealing an empty slot of an electrical enclosure, the method comprising:
 assembling a first conductive shell with a second conductive shell,
 the first conductive shell having a pair of first side walls and a pair of first end walls extending from a first bottom wall defining a first opening, the pair of first side walls each having at least one first outward bias positioned thereon, the pair of first end walls each having a first tab extending therefrom, and the first bottom wall having an array of first openings and a pair of apertures; and
 a second conductive shell having a pair of second side walls and a pair of second end walls extending from a second bottom wall defining a second opening, the pair of second side walls and pair of second end walls each having at least one second outward bias positioned thereon, and the second bottom wall having an array of second openings,
 wherein said first outward bias is configured to electrically connect to an inner surface defining the empty slot of the electrical enclosure, the second outward bias electrically connecting the second conductive shell to first conductive shell when the second conductive shell is disposed within the first opening defined by the first conductive shell.

* * * * *